(12) United States Patent
Weng et al.

(10) Patent No.: US 7,589,408 B2
(45) Date of Patent: Sep. 15, 2009

(54) STACKABLE SEMICONDUCTOR PACKAGE

(75) Inventors: Gwo-Liang Weng, Kaohsiung (TW);
Yung-Li Lu, Kaohsiung (TW);
Cheng-Yin Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 167 days.

(21) Appl. No.: 11/636,993

(22) Filed: Dec. 12, 2006

(65) Prior Publication Data

US 2007/0278640 A1 Dec. 6, 2007

(30) Foreign Application Priority Data

May 30, 2006 (TW) .............................. 95119249 A

(51) Int. Cl.
*H01L 23/02* (2006.01)
(52) U.S. Cl. ................... 257/686; 257/777; 257/787
(58) Field of Classification Search ................. 257/686, 257/777, 787, 778, 698
See application file for complete search history.

(56) References Cited

U.S. PATENT DOCUMENTS

| | | | |
|---|---|---|---|
| 6,451,624 B1 | 9/2002 | Farnworth et al. | |
| 6,501,165 B1 | 12/2002 | Farnworth et al. | |
| 6,521,881 B2 | 2/2003 | Tu et al. | |
| 6,593,662 B1 | 7/2003 | Pu et al. | |
| 6,614,101 B2 | 9/2003 | Misumi et al. | |
| 6,828,665 B2 | 12/2004 | Pu et al. | |
| 6,838,761 B2* | 1/2005 | Karnezos | 257/685 |
| 7,071,568 B1* | 7/2006 | St. Amand et al. | 257/777 |
| 7,354,800 B2 | 4/2008 | Carson | |
| 7,372,141 B2 | 5/2008 | Karnezos et al. | |
| 2004/0056277 A1 | 3/2004 | Karnezos | |
| 2004/0262774 A1* | 12/2004 | Kang et al. | 257/777 |
| 2005/0017340 A1* | 1/2005 | Shibue | 257/686 |
| 2005/0133916 A1 | 6/2005 | Karnezos | |
| 2005/0248019 A1* | 11/2005 | Chao et al. | 257/686 |
| 2007/0052089 A1 | 3/2007 | Kim et al. | |
| 2007/0096160 A1* | 5/2007 | Beroz et al. | 257/232 |
| 2007/0246815 A1* | 10/2007 | Lu et al. | 257/686 |
| 2008/0029869 A1* | 2/2008 | Kwon et al. | 257/686 |

FOREIGN PATENT DOCUMENTS

| | | |
|---|---|---|
| TW | 507340 | 10/1990 |
| TW | 571420 | 1/2004 |
| TW | I227533 | 2/2005 |
| TW | I227924 | 2/2005 |
| TW | 200522303 A | 7/2005 |
| TW | I244175 | 11/2005 |
| TW | 200611305 A | 4/2006 |

* cited by examiner

*Primary Examiner*—S. V Clark
(74) *Attorney, Agent, or Firm*—Volentine & Whitt, P.L.L.C.

(57) ABSTRACT

A stackable semiconductor package includes first and second substrates, a semiconductor device, first wires, a supporting element, and a first molding compound. The semiconductor device is disposed on the first substrate. The second substrate is disposed above the semiconductor device, and the area of the second substrate is larger than that of the semiconductor device. The first wires electrically connect the first and second substrates. The supporting element is disposed between the first and second substrates, and supports the second substrate. Some pads of the second substrate are exposed outside the first molding compound. Therefore, the overhang portion of the second substrate will not shake or sway during wire bonding, and the area of the second substrate can be increased to have more devices thereon. Also, the thickness of the second substrate can be reduced, to reduce the overall thickness of the stackable semiconductor package.

20 Claims, 4 Drawing Sheets

US 7,589,408 B2

STACKABLE SEMICONDUCTOR PACKAGE

BACKGROUND OF THE INVENTION

1. Field of the Invention

The present invention relates to a stackable semiconductor package, more particularly to a stackable semiconductor package having a supporting element.

2. Description of the Related Art

FIG. 1 is a schematic sectional view of a conventional stackable semiconductor package. The conventional stackable semiconductor package 1 comprises a first substrate 11, a chip 12, a second substrate 13, a plurality of wires 14, and a molding compound 15. The first substrate 11 has a first surface 111 and a second surface 112. The chip 12 is attached to the first surface 111 of the first substrate 11 by means of a flip chip. The second substrate 13 is adhered to the chip 12 by the use of an adhesive layer 16, and has a first surface 131 and a second surface 132, wherein the first surface 131 has a plurality of first pads 133 and a plurality of second pads 134 disposed thereon. From a top view, the area of the second substrate 13 is larger than that of the chip 12, such that the second substrate 13 partially extends beyond the chip 12, thus forming an overhang portion.

The wires 14 electrically connect the first pads 133 of the second substrate 13 to the first surface 111 of the first substrate 11. The molding compound 15 encapsulates the first surface 111 of the first substrate 11, the chip 12, the wires 14, and a portion of the second substrate 13, and the second pads 134 on the first surface 131 of the second substrate 13 are exposed outside the molding compound 15, thereby forming a mold area opening 17. Under ordinary circumstances, the conventional stackable semiconductor package 1 further comprises another package 18 or other devices stacked at the mold area opening 17, wherein solder balls 181 of the package 18 are electrically connected to the second pads 134 of the second substrate 13.

The disadvantages of the conventional stackable semiconductor package 1 are described as follows. First, as the second substrate 13 has an overhang portion, the first pads 133 are disposed in the periphery of the corresponding position (i.e., the overhang portion) of the chip 12. The distance between the corresponding position of the first pads 133 and the edge of the chip 12 is defined as an overhang length L1. Experimental results show that during the wire bonding process, when the overhang length L1 is more than three times larger than the thickness T1 of the second substrate 13, the overhang portion may shake or sway, which is disadvantageous for the wire bonding process. Further, during the wire bonding process, when the second substrate 13 is subjected to an excessive downward stress, the second substrate 13 may be cracked. Then, due to the above sway, shake or crack, the overhang portion cannot be too long, or it would limit the area of the second substrate 13, thus further limiting the layout space of the second pads 134 on the first surface 131 of the second substrate 13 exposed by the mold area opening 17. Finally, in order to overcome the above sway, shake or crack, the second substrate 13 cannot be too thin, such that the overall thickness of the conventional stackable semiconductor package 1 cannot be effectively reduced.

Therefore, it is necessary to provide a stackable semiconductor package having a supporting element to solve the above problems.

SUMMARY OF THE INVENTION

The objective of the present invention is to provide a stackable semiconductor package. The stackable semiconductor package comprises a first substrate, a semiconductor device, a second substrate, a plurality of first wires, a supporting element, and a first molding compound. The first substrate has a first surface and a second surface. The semiconductor device is disposed on the first surface of the first substrate, and is electrically connected thereto. The second substrate is disposed above the semiconductor device, and has a first surface and a second surface. The first surface of the second substrate has a plurality of first pads and a plurality of second pads disposed thereon. The area of the second substrate is larger than that of the semiconductor device, thus forming an overhang portion. The first wires electrically connect the first pads of the second substrate to the first surface of the first substrate. The supporting element is disposed between the first surface of the first substrate and the second surface of the second substrate for supporting the second substrate. The first molding compound encapsulates the first surface of the first substrate, the semiconductor device, the first wires, the supporting element, and a portion of the second substrate, and the second pads on the first surface of the second substrate are exposed outside the first molding compound. Therefore, during the wire bonding process, the sway, shake, or crack of the overhang portion of the second substrate may not occur, and the area of the second substrate can be increased to receive more devices disposed thereon. Moreover, the thickness of the second substrate can be reduced, so as to further reduce the overall thickness of the stackable semiconductor package.

DETAILED DESCRIPTION OF THE INVENTION

Figure 1:
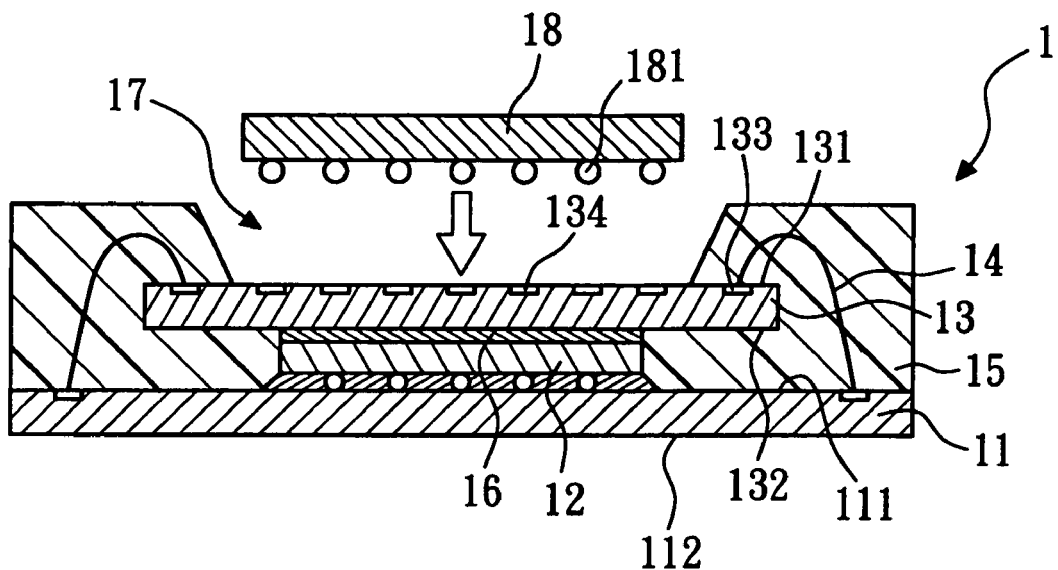
FIG. 1 is a schematic sectional view of a conventional stackable semiconductor package.
Figure 2:
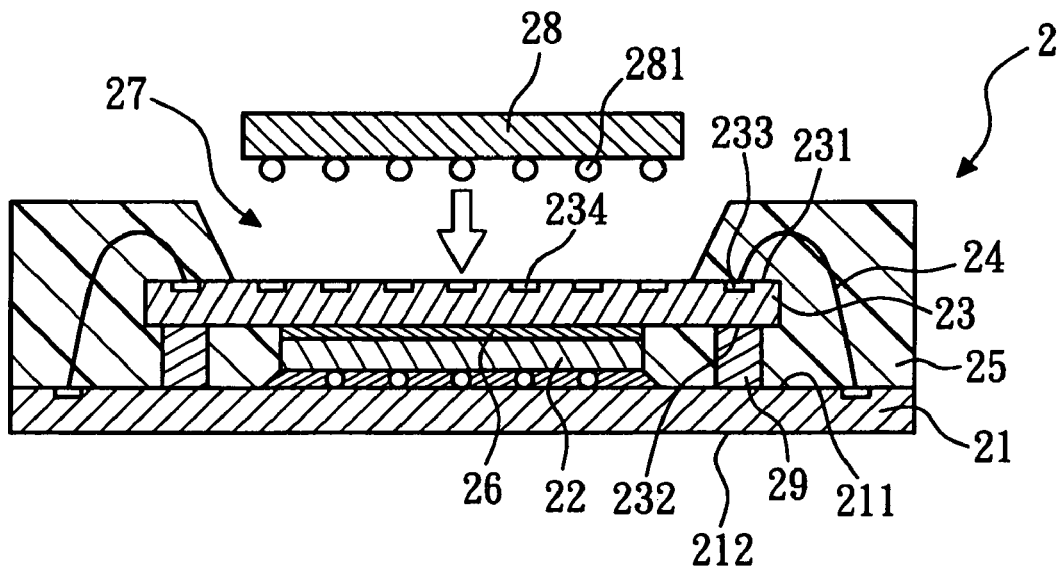
FIG. 2 is a schematic sectional view of a stackable semiconductor package according to a first embodiment of the present invention.

FIG. 2 is a schematic sectional view of the stackable semiconductor package according to the first embodiment of the present invention. The stackable semiconductor package 2 comprises a first substrate 21, a semiconductor device 22, a second substrate 23, a plurality of first wires 24, a supporting element 29, and a first molding compound 25. The first substrate 21 has a first surface 211 and a second surface 212. The semiconductor device 22 is disposed on the first surface 211 of the first substrate 21, and is electrically connected thereto. In the present embodiment, the semiconductor device 22 is a chip, which is attached to the first surface 211 of the first substrate 21 by means of a flip chip.

The second substrate 23 is adhered to the semiconductor device 22 by the use of an adhesive layer 26, and has a first surface 231 and a second surface 232, wherein the first surface 231 has a plurality of first pads 233 and a plurality of second pads 234 disposed thereon. From a top view, the area of the second substrate 23 is larger than that of the semiconductor device 22, such that the second substrate 23 partially extends beyond the semiconductor device 22, thus forming an overhang portion.

The first wires 24 electrically connect the first pads 233 of the second substrate 23 to the first surface 211 of the first substrate 21. The supporting element 29 is disposed between the first surface 211 of the first substrate 21 and the second surface 232 of the second substrate 23 to support the second substrate 23. In the embodiment, the supporting element 29 is a molding compound or a resin material. The first molding compound 25 encapsulates the first surface 211 of the first substrate 21, the semiconductor device 22, the first wires 24, the supporting element 29, and a portion of the second substrate 23, and the second pads 234 on the first surface 231 of the second substrate 23 are exposed outside the first molding compound 25, thus forming a mold area opening 27. Under ordinary circumstances, the stackable semiconductor package 2 further includes another package 28 or other devices stacked at the mold area opening 27, wherein solder balls 281 of the package 28 are electrically connected to the second pads 234 of the second substrate 23.

Figure 3:
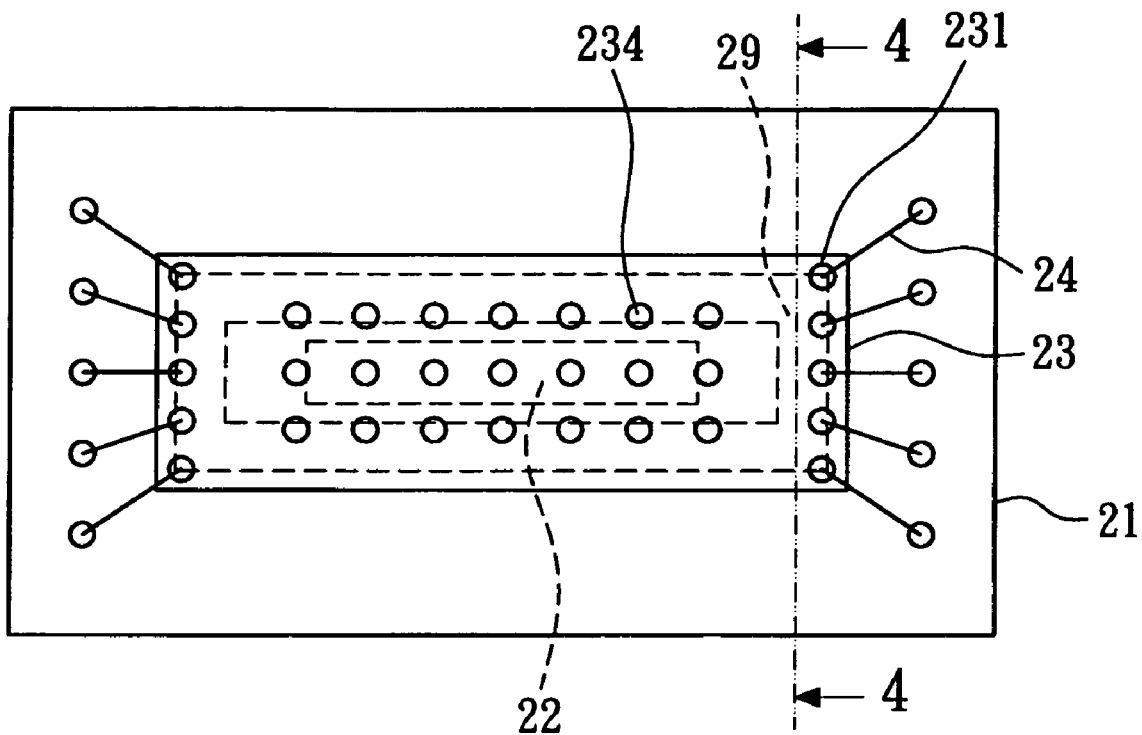
FIG. 3 is a schematic top view of the stackable semiconductor package of FIG. 2 without the first molding compound.

FIG. 3 is a schematic top view of the stackable semiconductor package of FIG. 2 without the first molding compound. In the present embodiment, four sides of the second substrate 23 all extend beyond the semiconductor device 22. However, it is reasonable that the second substrate 23 may have one side, two sides, or three sides extending beyond the semiconductor device 22. In the present embodiment, the supporting element 29 is an annular sidewall, which encloses a space to accommodate the semiconductor device 22. In other applications, if the second substrate 23 only has one side extending beyond the semiconductor device 22 to form an overhang portion, the supporting element 29 is only an elongated sidewall disposed between the first surface 211 of the first substrate 21 and the overhang portion of the second substrate 23, so as to support the overhang portion of the second substrate 23. The first pads 233 are disposed in the periphery of the corresponding position of the chip 22 (i.e., the overhang portion). The distance between the corresponding position of the first pads 233 and the edge of the chip 22 is defined as an overhang length L2. In the present embodiment, due to the support of the supporting element 29, even if the overhang length L2 is more than three times larger than the thickness T2 of the second substrate 23, the overhang portion will not shake or sway during the wire bonding process.

In the present embodiment, the supporting element 29 is a third molding compound formed by pre-molding, and the material thereof can be the same as or different from that of the first molding compound 25. In another application, the supporting element 29 is a dispensed resin material formed by dispensing.

Figure 4:
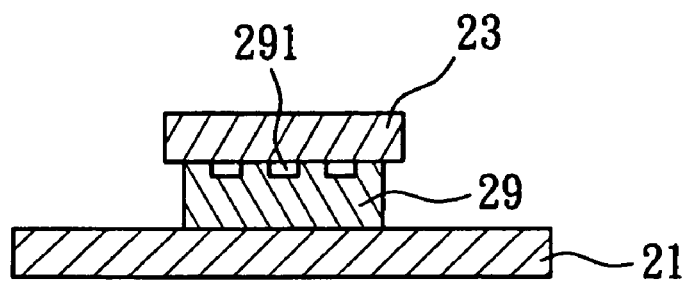
FIG. 4 is a schematic sectional view along line 4-4 of FIG. 3.

FIG. 4 is a schematic sectional view along line 4-4 in FIG. 3. In the present embodiment, a plurality of through holes 291 is disposed on the sidewall of the supporting element 29, so as to facilitate the flow of the first molding compound 25. In another application, the through holes 291 penetrate the sidewall of the supporting element 29 from top to bottom, such that the supporting element 29 is composed of a plurality of discontinuous sidewalls. Similarly, the discontinuous sidewalls also enclose a space to accommodate the semiconductor device 22.

Figure 5:
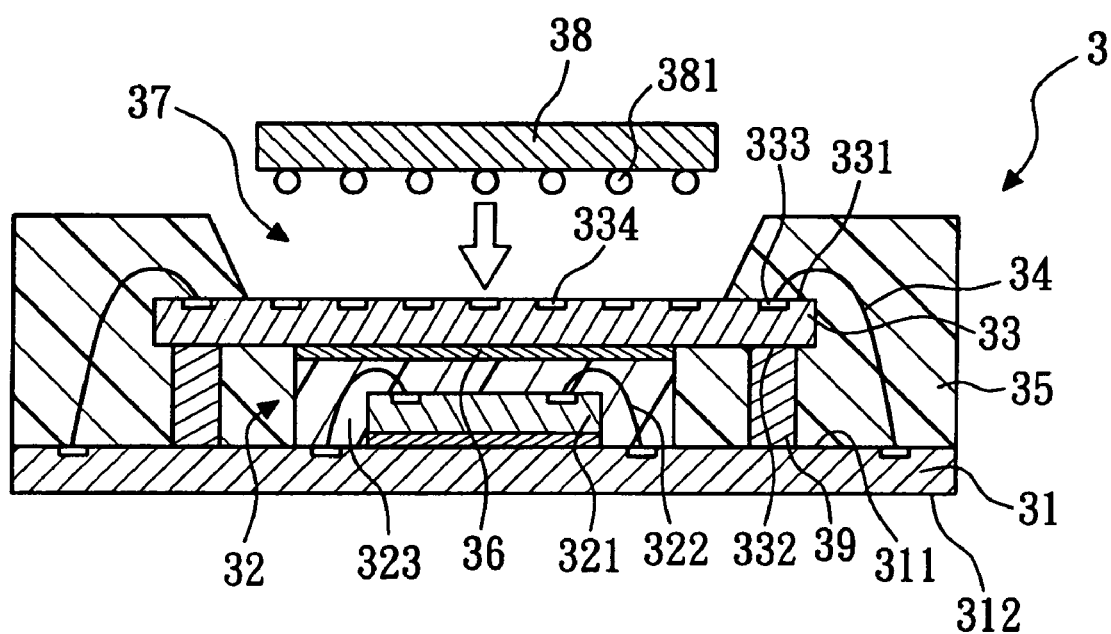
FIG. 5 is a schematic sectional view of a stackable semiconductor package according to a second embodiment of the present invention.

FIG. 5 is a schematic sectional view of the stackable semiconductor package according to a second embodiment of the present invention. The stackable semiconductor package 3 comprises a first substrate 31, a semiconductor device 32, a second substrate 33, a plurality of first wires 34, a supporting element 39, and a first molding compound 35. The first substrate 31 has a first surface 311 and a second surface 312. The semiconductor device 32 is disposed on the first surface 311 of the first substrate 31, and is electrically connected thereto. In the present embodiment, the semiconductor device 32 is a sub-package including a chip 321, a plurality of second wires 322, and a second molding compound 323. The chip 321 is adhered to the first surface 311 of the first substrate 31. The second wires 322 electrically connect the chip 321 to the first surface 311 of the first substrate 31. The second molding compound 323 encapsulates the chip 321, the second wires 322, and a portion of the first surface 311 of the first substrate 31.

The second substrate 33 is adhered to the semiconductor device 32 by the use of an adhesive layer 36. The second substrate 33 has a first surface 331 and a second surface 332, wherein the first surface 331 has a plurality of first pads 333 and a plurality of second pads 334 disposed thereon. From a top view, the area of the second substrate 33 is larger than that of the semiconductor device 32, such that the second substrate 33 partially extends beyond the semiconductor device 32, thus forming an overhang portion.

The first wires 34 electrically connect the first pads 333 of the second substrate 33 to the first surface 311 of the first substrate 31. The supporting element 39 is disposed between the first surface 311 of the first substrate 31 and the second surface 332 of the second substrate 33 to support the second substrate 33. The supporting element 39 of the present embodiment is identical with the supporting element 29 of the first embodiment. The first molding compound 35 encapsulates the first surface 311 of the first substrate 31, the semiconductor device 32, the first wires 34, the supporting element 39, and a portion of the second substrate 33, and the second pads 334 on the first surface 331 of the second substrate 33 are exposed outside the first molding compound 35, thus forming a mold area opening 37. Under ordinary circumstances, the stackable semiconductor package 3 further includes another package 38 or other devices stacked at the mold area opening 37, wherein solder balls 381 of the package 38 are electrically connected to the second pads 334 of the second substrate 33.

Figure 6:
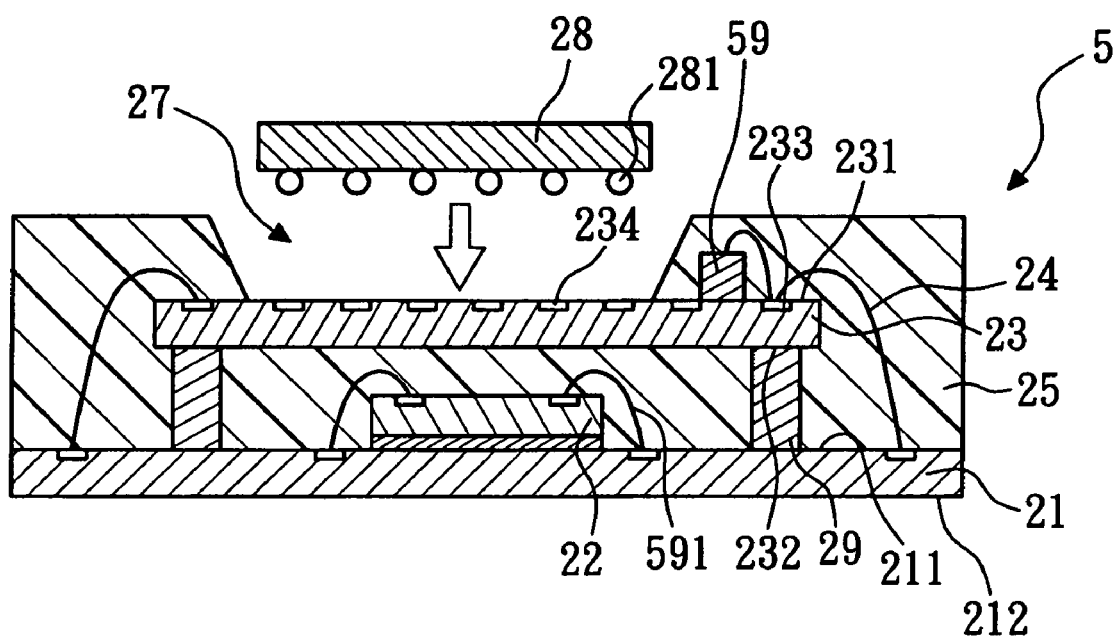
FIG. 6 is a schematic sectional view of a stackable semiconductor package according to a third embodiment of the present invention.

FIG. 6 is a schematic sectional view of a stackable semiconductor package according to a third embodiment of the present invention. The stackable semiconductor package 5 of the present embodiment is similar to the stackable semiconductor package 2 (FIG. 2) of the first embodiment, and the same devices are indicated by the same reference numerals. The difference therebetween lies in that the semiconductor device 22 (i.e., the chip) in the present embodiment is adhered to the top surface of the substrate 21 and is electrically connected thereto via a plurality of second wires 591. Moreover, the present embodiment further includes at least one active device 59 (for example, an analog chip). The active device 59 is disposed on the first surface 231 of the second substrate 23 and is encapsulated by the first molding compound 25. It is reasonable that the stackable semiconductor package 2 of the first embodiment can also include the active device 59.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A stackable semiconductor package, comprising:
a first substrate having a first surface and a second surface;
a semiconductor device disposed on the first surface of the first substrate, and electrically connected to the first surface of the first substrate;
a second substrate disposed above the semiconductor device, and having a first surface and a second surface, wherein the first surface of the second substrate has a plurality of first pads and a plurality of second pads disposed thereon, and an area of the second substrate is larger than that of the semiconductor device;
a plurality of first wires electrically connecting the first pads of the second substrate to the first surface of the first substrate;
a supporting element disposed between the first surface of the first substrate and the second surface of the second substrate, so as to support the second substrate, wherein the supporting element is an annular sidewall, which encloses a space to accommodate the semiconductor device; and
a first molding compound encapsulating the first surface of the first substrate, the semiconductor device, the first wires, the supporting element, and a portion of the second substrate, and exposing the second pads on the first surface of the second substrate, wherein the annular sidewall has a plurality of through holes for facilitating flow of the first molding compound.

2. The stackable semiconductor package as claimed in claim 1, wherein the semiconductor device is a flip chip attached to the first surface of the first substrate.

3. The stackable semiconductor package as claimed in claim 1, wherein the semiconductor device is a chip adhered to the first surface of the first substrate and electrically connected to the first surface of the first substrate via a plurality of second wires.

4. The stackable semiconductor package as claimed in claim 1, wherein the semiconductor device is a sub-package, and the sub-package comprises a chip, a plurality of second wires, and a second molding compound; the chip is adhered to the first surface of the first substrate; the second wires electrically connect the chip and the first surface of the first substrate; the second molding compound encapsulates the chip, the second wires, and a portion of the first surface of the first substrate.

5. The stackable semiconductor package as claimed in claim 1, wherein the second substrate extends beyond the semiconductor device, thus forming an overhang portion; the supporting element is disposed between the first surface of the first substrate and the overhang portion of the second substrate, so as to support the overhang portion of the second substrate.

6. The stackable semiconductor package as claimed in claim 1, wherein the second substrate is adhered to the semiconductor device via an adhesive layer.

7. The stackable semiconductor package as claimed in claim 1, wherein the supporting element is a second molding compound which is a pre-molded molding compound.

8. The stackable semiconductor package as claimed in claim 1, wherein the supporting element is a dispensed resin material.

9. The stackable semiconductor package as claimed in claim 1, wherein one side of the second substrate extends beyond the semiconductor device to form an overhang portion; and the supporting element is an elongated sidewall disposed between the first surface of the first substrate and the overhang portion of the second substrate, so as to support the overhang portion of the second substrate.

10. The stackable semiconductor package as claimed in claim 9, wherein the supporting element has a plurality of through holes, so as to facilitate flow of the first molding compound.

11. The stackable semiconductor package as claimed in claim 1, further comprising at least one active device disposed on the first surface of the second substrate and encapsulated by the first molding compound.

12. The stackable semiconductor package as claimed in claim 1, wherein the first pads are disposed at a periphery of a corresponding position of the semiconductor device.

13. The stackable semiconductor package as claimed in claim 12, wherein a distance between a corresponding position of the first pads and an edge of the semiconductor device is defined as an overhang length, which is more than three times larger than a thickness of the second substrate.

14. A stackable semiconductor package, comprising:
a first substrate having a first surface and a second surface;
a semiconductor device disposed on the first surface of the first substrate, and electrically connected to the first surface of the first substrate;
a second substrate disposed above the semiconductor device, and having a first surface and a second surface, wherein the first surface of the second substrate has a plurality of first pads and a plurality of second pads disposed thereon, and an area of the second substrate is larger than that of the semiconductor device;
a plurality of first wires electrically connecting the first pads of the second substrate to the first surface of the first substrate;
a supporting element disposed between the first surface of the first substrate and the second surface of the second substrate, so as to support the second substrate, wherein the supporting element comprises a plurality of discontinuous sidewalls, and the sidewalls enclose a space to accommodate the semiconductor device; and
a first molding compound encapsulating the first surface of the first substrate, the semiconductor device, the first wires, the supporting element, and a portion of the second substrate, and exposing the second pads on the first surface of the second substrate.

15. The stackable semiconductor package as claimed in claim 14, wherein the semiconductor device is a sub-package, and the sub-package comprises a chip, a plurality of second wires, and a second molding compound; the chip is adhered to the first surface of the first substrate; the second wires electrically connect the chip and the first surface of the first substrate; the second molding compound encapsulates the chip, the second wires, and a portion of the first surface of the first substrate.

16. The stackable semiconductor package as claimed in claim 14, wherein the second substrate extends beyond the semiconductor device, thus forming an overhang portion; the supporting element is disposed between the first surface of the first substrate and the overhang portion of the second substrate, so as to support the overhang portion of the second substrate.

17. The stackable semiconductor package as claimed in claim 14, wherein one side of the second substrate extends beyond the semiconductor device to form an overhang portion; and the supporting element is an elongated sidewall disposed between the first surface of the first substrate and the overhang portion of the second substrate, so as to support the overhang portion of the second substrate.

18. The stackable semiconductor package as claimed in claim 14, further comprising at least one active device disposed on the first surface of the second substrate and encapsulated by the first molding compound.

19. The stackable semiconductor package as claimed in claim 14, wherein the first pads are disposed at a periphery of a corresponding position of the semiconductor device.

20. The stackable semiconductor package as claimed in claim 19, wherein a distance between a corresponding position of the first pads and an edge of the semiconductor device is defined as an overhang length, which is more than three times larger than a thickness of the second substrate.

* * * * *